(12) United States Patent
Mizumasa (10) Patent No.: US 7,764,116 B2
(45) Date of Patent: Jul. 27, 2010

(54) CUTOFF FREQUENCY ADJUSTING METHOD, GMC FILTER CIRCUIT AND SEMICONDUCTOR DEVICE

(75) Inventor: Tatsuhiro Mizumasa, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/111,556

(22) Filed: Apr. 29, 2008

(65) Prior Publication Data

US 2009/0027115 A1    Jan. 29, 2009

(30) Foreign Application Priority Data

Jul. 25, 2007    (JP) ............... 2007-193424

(51) Int. Cl.
*H03K 5/00*    (2006.01)
(52) U.S. Cl. .................. 327/553; 327/554; 327/558
(58) Field of Classification Search .......... 327/551–559
See application file for complete search history.

(56) References Cited

U.S. PATENT DOCUMENTS

| | | | |
|---|---|---|---|
| 5,594,383 A * | 1/1997 | Tamba | 327/552 |
| 6,084,465 A * | 7/2000 | Dasgupta | 327/554 |
| 6,112,125 A | 8/2000 | Sandusky | |
| 7,239,197 B2 * | 7/2007 | Chen et al. | 327/553 |

FOREIGN PATENT DOCUMENTS

| | | |
|---|---|---|
| EP | 1 513 253 A | 3/2005 |
| JP | 2003-008398 | 1/2003 |
| JP | 2004-266316 | 9/2004 |
| JP | 2005-286778 | 10/2005 |
| JP | 2005-348109 | 12/2005 |
| WO | WO 2004/023653 A | 3/2004 |

OTHER PUBLICATIONS

Lopez-Martinez A. et al.; "A 150 MHz Continuous-Time Seventh Order 0.05° Equiripple Linear Phase Filter with Automatic Tuning System"; May 6, 2001; IEEE International Symposium on Circuits and Systems ; New York, NY; pp. 156-159; XP010541391.

* cited by examiner

Primary Examiner—Dinh T. Le
(74) Attorney, Agent, or Firm—Arent Fox LLP

(57) ABSTRACT

A cutoff frequency adjusting method adjusts a cutoff frequency of a GmC filter circuit which has a capacitor and an Operational Transconductance Amplifier (OTA) circuit with a controllable Gm value. A Gm value of the OTA circuit is detected based on a voltage of the capacitor which is charged by an output of the OTA circuit, and a cutoff frequency of the GmC circuit is set to a desired value by controlling the Gm value of the OTA circuit constant based on the detected Gm value.

16 Claims, 5 Drawing Sheets

CUTOFF FREQUENCY ADJUSTING METHOD, GMC FILTER CIRCUIT AND SEMICONDUCTOR DEVICE

BACKGROUND OF THE INVENTION

1. Field of the Invention

The present invention generally relates to cutoff frequency adjusting methods, GmC filter circuits and semiconductor devices, and more particularly to a cutoff frequency adjusting method for adjusting a cutoff frequency of a GmC filter, a GmC filter circuit which employs such a cutoff frequency adjusting method, and a semiconductor device having such a GmC filter circuit.

2. Description of the Related Art

Electronic apparatuses having an analog data processing circuit, such as portable telephones, includes a filter circuit for noise reduction and the like. A cutoff frequency of the filter circuit deviates depending on inconsistencies that are introduced at a production stage of elements forming the filter circuit, and for this reason, the filter circuit in most cases cannot eliminate all target frequencies.

Figure 1:
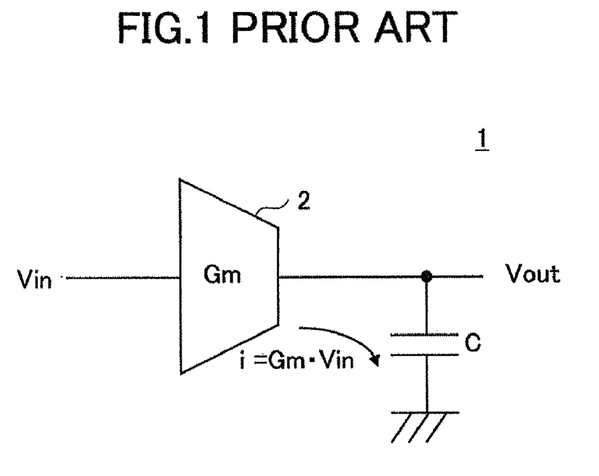
FIG. 1 is a circuit diagram showing an example of a conventional GmC filter circuit.

FIG. 1 is a circuit diagram showing an example of a conventional GmC filter circuit. A GmC filter circuit 1 includes an Operational Transconductance Amplifier (OTA) circuit 2 and a capacitor C that are connected as shown in FIG. 1. If an input signal to the GmC filter circuit 1 is denoted by Vin, an output signal of the GmC filter circuit 1 is denoted by Vout, a capacitance of the capacitor C is denoted by C, and a gm value of the OTA circuit 2 is denoted by Gm, the output signal Vout can be represented by $Vout=(Gm \cdot Vin)/j\omega C$. A cutoff frequency Fc of the GmC filter circuit 1 is determined by $Fc=Gm \cdot Vin/C$. A GmC value of the GmC filter circuit 1 can be set arbitrarily by setting the Gm value of the OTA circuit 2 and the capacitance C of the capacitor C to appropriate designed values.

The GmC filter circuit 1 has a Low-Pass Filter (LPF) characteristic. However, when forming the GmC filter circuit 1 in a semiconductor integrated circuit such as a Large Scale Integrated (LSI) circuit, the Gm value and the capacitance C deviate from the respective designed values due to inconsistencies introduced at the production stage of the semiconductor integrated circuit, and the desired LPF characteristic cannot be obtained. In other words, even if the Gm value and the capacitance C deviate from the respective designed values, the cutoff frequency Fc of the GmC filter circuit 1 cannot be determined because there is no means for detecting the GmC value, and it is difficult to form the GmC filter circuit 1 which can maintain the cutoff frequency Fc to a constant value.

In addition, according to another example of the conventional GmC filter circuit, a capacitor having a capacitance equal to or proportional to the capacitance of the capacitor within the GmC filter circuit is provided within the OTA circuit in order to maintain the GmC value constant. In this case, a switched capacitor may be used for the capacitor within the OTA circuit, and the GmC value can be controlled constant by constantly inputting an arbitrary clock to the GmC filter circuit. However, in this GmC filter circuit which maintains the GmC value constant, the clock must constantly be input to the GmC filter circuit, and it is difficult to reduce the power consumption of the GmC filter circuit. For this reason, this kind of GmC filter circuit is unsuited for use in electronic apparatuses which require low power consumption, such as portable telephones.

For example, a filter circuit using a conductance amplifier (Gm amplifier) is proposed in a Japanese Laid-Open Patent Application No. 2004-266316. GmC filter circuits are proposed in Japanese Laid-Open Patent Applications No. 2003-8398, No. 2005-348109 and No. 2005-286778, for example. The Japanese Laid-Open Patent Application No. 2005-348109 proposes a GmC filter circuit using a switched capacitor.

Therefore, in the conventional GmC filter circuits, it was conventionally difficult to simultaneously maintain the GmC value constant and realize a low power consumption.

SUMMARY

According to one aspect of an embodiment, there is provided a cutoff frequency adjusting method for adjusting a cutoff frequency of a GmC filter circuit which has a capacitor and an Operational Transconductance Amplifier (OTA) circuit with a controllable Gm value, comprising the steps of (a) detecting a Gm value of the OTA circuit based on a voltage of the capacitor which is charged by an output of the OTA circuit; and (b)

setting a cutoff frequency of the GmC circuit to a desired value by controlling the Gm value of the OTA circuit constant based on the Gm value detected in said step (a). According to the cutoff frequency adjusting method, it is possible to simultaneously maintain the GmC value constant and realize a low power consumption.

According to another aspect of the embodiment, there is provided a GmC filter circuit comprising an Operational Transconductance Amplifier (OTA) circuit with a controllable Gm value; a capacitor; a detecting circuit configured to detect a Gm value based on a voltage of the capacitor which is charged by an output of the OTA circuit; and a control circuit configured to set a cutoff frequency of the GmC filter circuit to a desired value by controlling the Gm value of the OTA circuit constant based on the Gm value detected by the detecting circuit. According to the GmC filter circuit, it is possible to simultaneously maintain the GmC value constant and realize a low power consumption.

According to still another aspect of the embodiment, there is provided a semiconductor device comprising a GmC filter circuit, wherein the GmC filter circuit comprises an Operational Transconductance Amplifier (OTA) circuit with a controllable Gm value; a capacitor; a detecting circuit configured to detect a Gm value based on a voltage of the capacitor which is charged by an output of the OTA circuit; and a control circuit configured to set a cutoff frequency of the GmC filter circuit to a desired value by controlling the Gm value of the OTA circuit constant based on the Gm value detected by the detecting circuit. According to the semiconductor device, it is possible to simultaneously maintain the GmC value constant and realize a low power consumption.

Other objects and further features of the present invention will be apparent from the following detailed description when read in conjunction with the accompanying drawings.

DESCRIPTION OF THE PREFERRED EMBODIMENTS

According to one embodiment of the present invention, a cutoff frequency of a GmC filter circuit, which has a capacitor and an Operational Transconductance Amplifier (OTA) circuit with a controllable Gm value, is automatically adjusted. A Gm value of the OTA circuit is detected based on a voltage of the capacitor which is charged by an output of the OTA circuit, and a cutoff frequency of the GmC circuit is set to a desired value by controlling the Gm value of the OTA circuit constant based on the detected Gm value.

By adjusting the cutoff frequency of the GmC filter circuit in this manner, it becomes possible to simultaneously maintain the GmC value constant and realize a low power consumption.

Next, a description will be given of embodiments of a cutoff frequency adjusting method, a GmC filter circuit and a semiconductor device according to the present invention, by referring to FIGS. 2 through 6.

Figure 2:
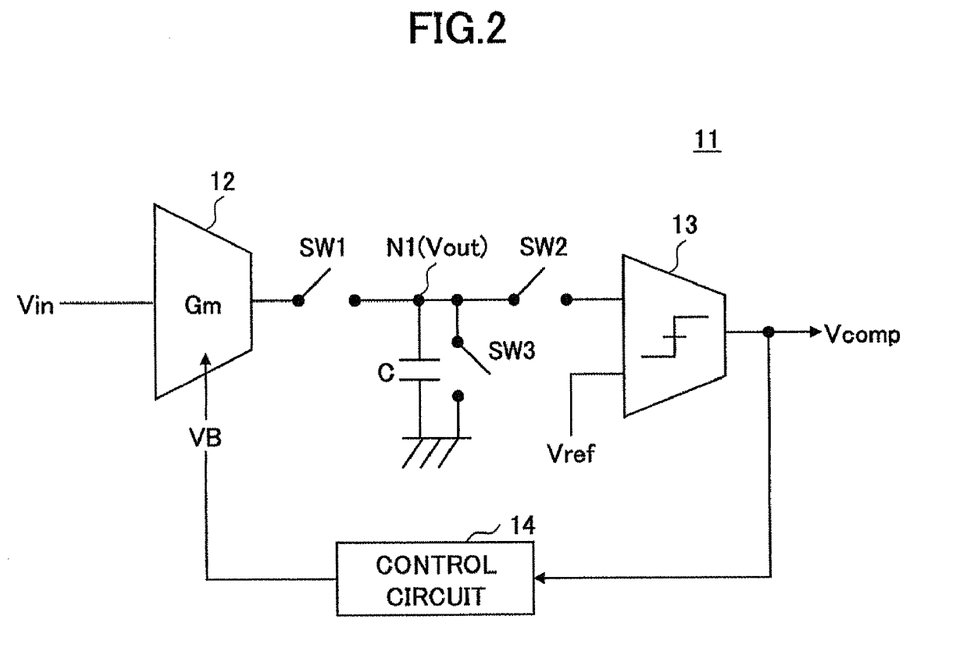
FIG. 2 is a circuit diagram showing a GmC filter circuit in a first embodiment of the present invention.

FIG. 2 is a circuit diagram showing a GmC filter circuit in a first embodiment of the present invention. A GmC filter circuit 11 includes an OTA circuit 12 having a controllable gm value, switches SW1, SW2 and SW3, a capacitor C, a comparator circuit 13 and a control circuit 14 which are connected as shown in FIG. 2. The switches SW1, SW2 and SW3 and the capacitor C are connected via a node N1. In the following description, a capacitance of the capacitor C is denoted by C, the gm value of the OTA circuit 12 is denoted by Gm, and a reference signal input to the comparator circuit 13 is denoted by Vref. An input signal Vin to the GmC filter circuit 11 is input to the OTA circuit 12, and an input signal Vin having a known value Vinref is input to the OTA circuit 12 when adjusting the Gm value of the OTA circuit 12. An output signal Vout of the GmC filter circuit 11 is output via the node N1. An output signal Vcomp of the comparator circuit 13 is fed back to the OTA circuit 12 via the control circuit 14, and the Gm value of the OTA circuit 12 is controlled by a bias control of a control signal VB which is output from the control circuit 14. ON and OFF timings (hereinafter simply referring to as ON/OFF timings) of the switches SW1, SW2 and SW3 may be controlled by ON/OFF control signals output from the control circuit 14 within the GmC filter circuit 11 or, by ON/OFF control signals output from a control means (not shown), such as a control circuit, a controller and a processor, such as a Central Processing Unit (CPU), which is provided outside the GmC filter circuit 11. In other words, the ON/OFF timings of the switches SW1, SW2 and SW3 may be controlled by a control circuit or means which is internal or external to the GmC filter circuit 11. The cutoff frequency adjusting method adjusts a cutoff frequency Fc of the GmC filter circuit 11 by feeding back the output signal Vcomp of the comparator circuit 13 to the OTA circuit 12, and controlling the Gm value of the OTA circuit 12 by controlling the ON/OFF timings of the switches SW1, SW2 and SW3 by the control circuit or means which is internal or external to the GmC filter circuit 11, in order to control the Gm value of the OTA circuit 12. In a case where the ON/OFF timings of the switches SW1, SW2 and SW3 are controlled by the control means which is external to the GmC filter circuit 11, the output signal Vcomp of the comparator circuit 13 is supplied to this external control means.

When forming the GmC filter circuit 11 in a semiconductor integrated circuit such as a Large Scale Integrated (LSI) circuit, the GmC filter circuit 11 is formed on the same substrate as the external control means (that is, the control circuit, the controller or the processor, such as the CPU), which is provided externally to the GmC filter circuit 11, to thereby form a semiconductor device or semiconductor chip.

The cutoff frequency Fc of the GmC filter circuit 11 is determined by Fc=Gm·Vin/C. Accordingly, a Low-Pass Filter (LPF) characteristic of the GmC filter circuit 11 is determined a Gm/C value, and the LPF characteristic can be maintained constant by controlling this Gm/C value constant.

The GmC value of the GmC filter circuit 11 can be set arbitrarily by setting the Gm value of the OTA circuit 12 and the capacitance C of the capacitor C to appropriate designed values. However, when forming the GmC filter circuit 11 in the semiconductor integrated circuit such as the LSI circuit, the Gm value and the capacitance C deviate from the respective designed values due to inconsistencies introduced during the production stage of the semiconductor integrated circuit. In this embodiment, even if the Gm value and the capacitance C deviate from the respective designed values due to the inconsistencies introduced during the production stage of the semiconductor integrated circuit, the Gm value of the OTA circuit 12 is controlled based on the output signal Vcomp of the comparator circuit 13 in order to control the Gm/C value constant and to maintain the LPF characteristic constant.

Figure 3:
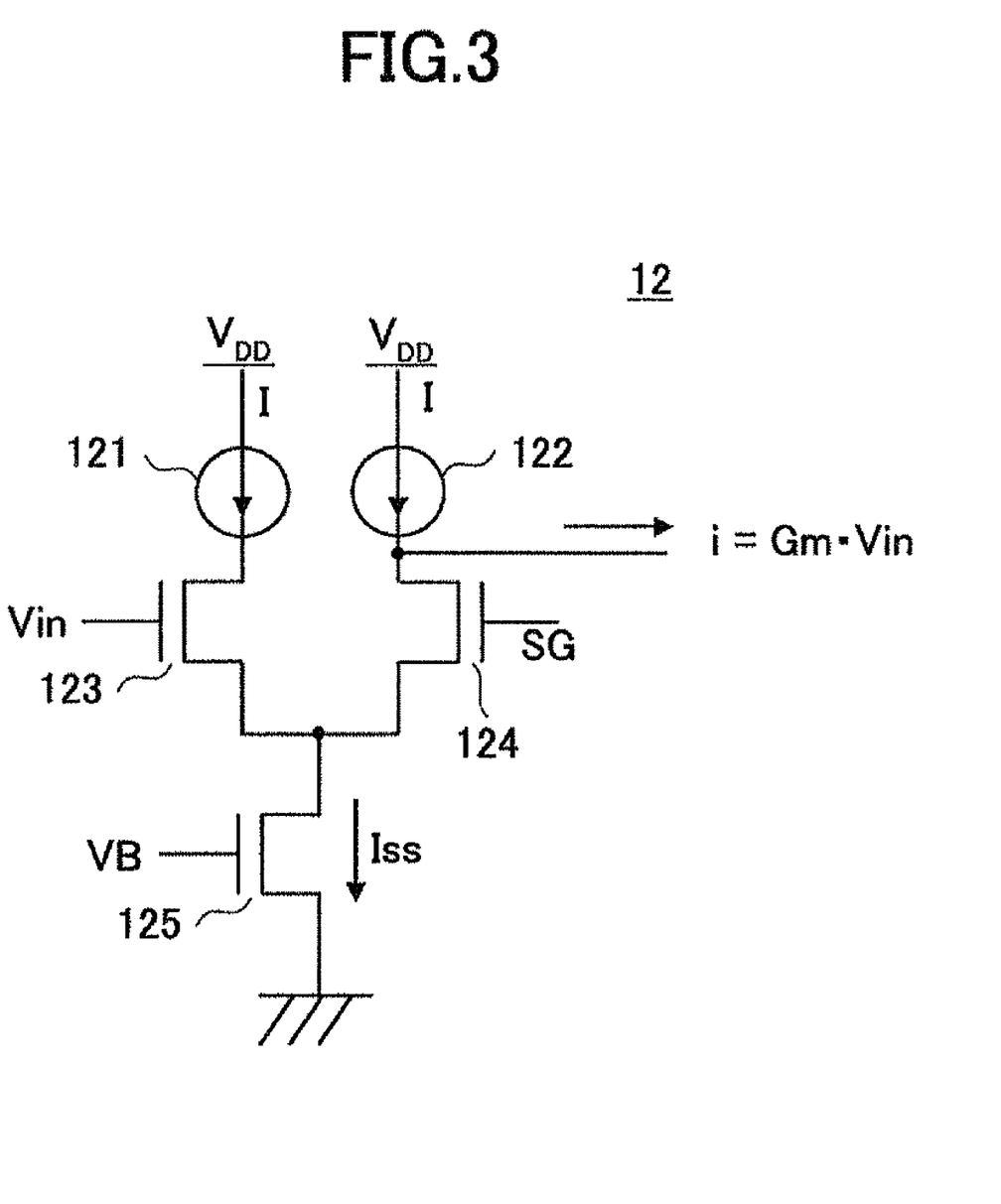
FIG. 3 is a circuit diagram showing an Operational Transconductance Amplifier (OTA) circuit.

FIG. 3 is a circuit diagram showing the OTA circuit 12. The OTA circuit 12 includes current sources 121 and 122, and NMOS transistors 123, 124 and 125 which are connected as shown in FIG. 3. The input signal Vin is input to a gate of the NMOS transistor 123, and the control signal VB is input to a gate of the NMOS transistor 125. In FIG. 3, $V_{DD}$ denotes a power supply voltage, SG denotes a reference signal input to a gate of the NMOS transistor 124, $I_{SS}$ denotes a tail current flowing through the NMOS transistor 125, and i denotes an output current of the OTA circuit 12 represented by i=Gm·Vin. The Gm value of this OTA circuit 12 can be represented by Gm=$\{2 \cdot (ISS/\beta)\}^{1/2}$, where β denotes a parameter which determines a current that flows through the NMOS transistor 125. Accordingly, it may be seen that the Gm value can be controlled by controlling the control signal VB.

Figure 4:
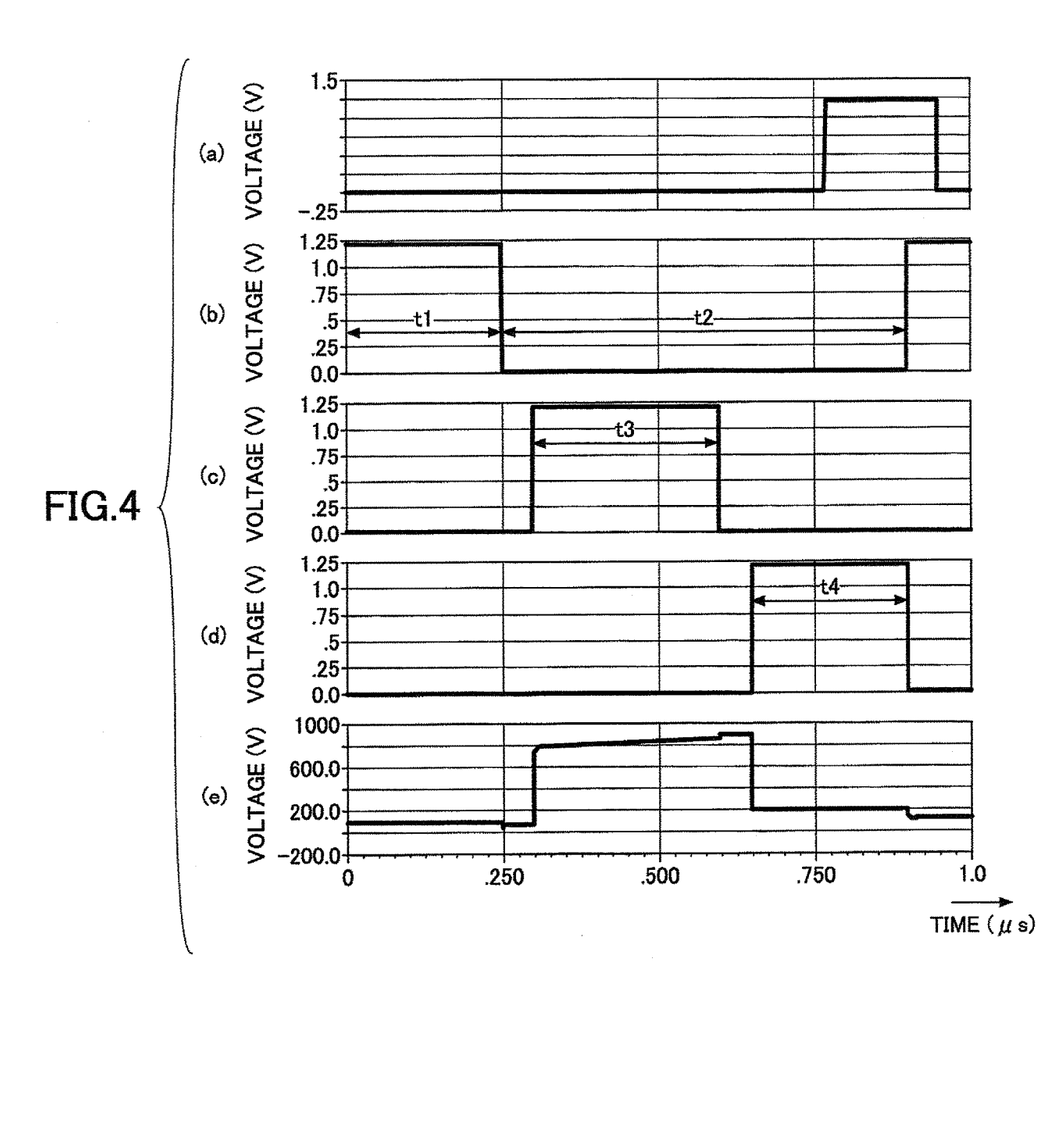
FIG. 4 is a time chart for explaining an operation of the GmC filter circuit.

FIG. 4 is a time chart for explaining an operation of the GmC filter circuit 11. In FIG. 4, the ordinate indicates the voltage (V), and the abscissa indicates the time (μs). In FIG. 4, (a) shows the output signal Vcomp of the comparator circuit 13, (b) shows the ON/OFF control signal input to the switch SW3, (c) shows the ON/OFF control signal input to the switch SW1, (d) shows the ON/OFF control signal input to the switch SW2, (e) shows a potential at the node N1, that is, the output signal Vout of the GmC filter circuit 11. It is assumed for the sake of convenience that each of the switches SW1, SW2 and SW3 is turned ON (that is, assumes a closed state for passing an incoming signal) during a high-level period of the ON/OFF control signal that is input thereto, and is turned OFF (that is, assumes an open state for blocking an incoming signal) during a low-level period of the ON/OFF control signal that is input thereto.

First, as shown in FIG. 4(*b*), the switch SW3 is turned ON for a time t1 to carry out an initializing (or clearing) process in order to discharge the charge in the capacitor C1, and the switch SW3 is thereafter turned OFF for a time t2 in order to enable a charge to be charged in the capacitor C.

At the time when the initializing process is carried out, the input signal Vin to the GmC filter circuit 11 is input to the OTA circuit 12, and the switch SW1 is turned ON for a time t3 as shown in FIG. 4(*c*). At this point in time, the input signal Vin has the known value Vinref, and because the time t2 is a known value, a voltage Vc which is charged in the capacitor C can be represented by Vc=(Vin·Gm)t3/C. After this time t3 elapses, the switch SW1 is turned OFF, and the switch SW2 is turned ON for a time t4 as shown in FIG. 4(*d*). A relationship t2>(t3+t4) stands among the times t2, t3 and t4. At this point in time, the comparator circuit 13 compares the voltage Vc and the voltage of the reference signal Vref, and outputs a high-level or low-level output signal Vcomp at the instant when a relationship Vc>= (that is, greater than or equal to) Vref is satisfied. The value of the reference signal Vref is preset to the value of the voltage Vc which is required to obtain a desired GmC value. Hence, the switches SW1, SW2 and SW3 and the comparator circuit 13 form a detecting circuit or means for detecting the Gm value of the OTA circuit 12. In addition, the control circuit or means internal or external to the GmC filter circuit 11, which controls the ON/OFF timings of the switches SW1, SW2 and SW3, in effect controls a timing when the initializing process is carried out by short-circuiting the capacitor C, a timing when the capacitor C is charged by supplying the output of the OTA circuit 12 to the capacitor C for the known time t3, and a timing when the voltage Vc of the charged capacitor C and the voltage (that is, the reference signal) Vref of the capacitor C when the desired Gm value is obtained are compared. The control circuit 14 judges that the Gm value of the OTA circuit 12 is the designed value when the output signal Vcomp of the comparator circuit 13 has a high level in the case of the positive logic, and when the output signal Vcomp of the comparator circuit 13 has a low level in the case of the negative logic. When the control circuit 14 judges that the Gm value of the OTA circuit 12 is the designed value, the control circuit 14 supplies the control signal VB, corresponding to the designed Gm value, to the OTA circuit 12 of the GmC filter circuit 11.

The comparator circuit 13 compares the voltage Vc and the voltage of the reference signal Vref, and turns the switch SW2 OFF and turns the switch SW3 ON when Vc<Vref, in order to short-circuit the two terminals of the capacitor C and clear (or discharge) the charge. In addition, with respect to the value of the control signal VB corresponding to the designed Gm value, the control circuit 13 increases the value of the control signal VB which is supplied to the OTA circuit 12 by a predetermined value, and an operations similar to that described above is repeated until the relationship Vc>=Vref is satisfied.

Accordingly, even if the Gm value and the capacitance C deviate from the respective designed values due to inconsistencies introduced at the production stage, the LPF characteristic can be maintained constant by controlling the Gm/C value constant, by controlling the Gm value of the OTA circuit 12 based on the output signal Vcomp of the comparator circuit 13. Thus, it is possible to set the cutoff frequency Fc of the GmC filter circuit 11 to a desired value. In other words, by accurately detecting the GmC value of the GmC filter circuit 11, it becomes possible to adjust the cutoff frequency Fc to the desired value. Furthermore, it is unnecessary to constantly input a constant clock to the GmC filter circuit 11 in order to control the GmC value constant. Therefore, it is possible to simultaneously maintain the GmC value of the GmC filter circuit 11 constant and realize a low power consumption of the GmC filter circuit 11.

Figure 5:
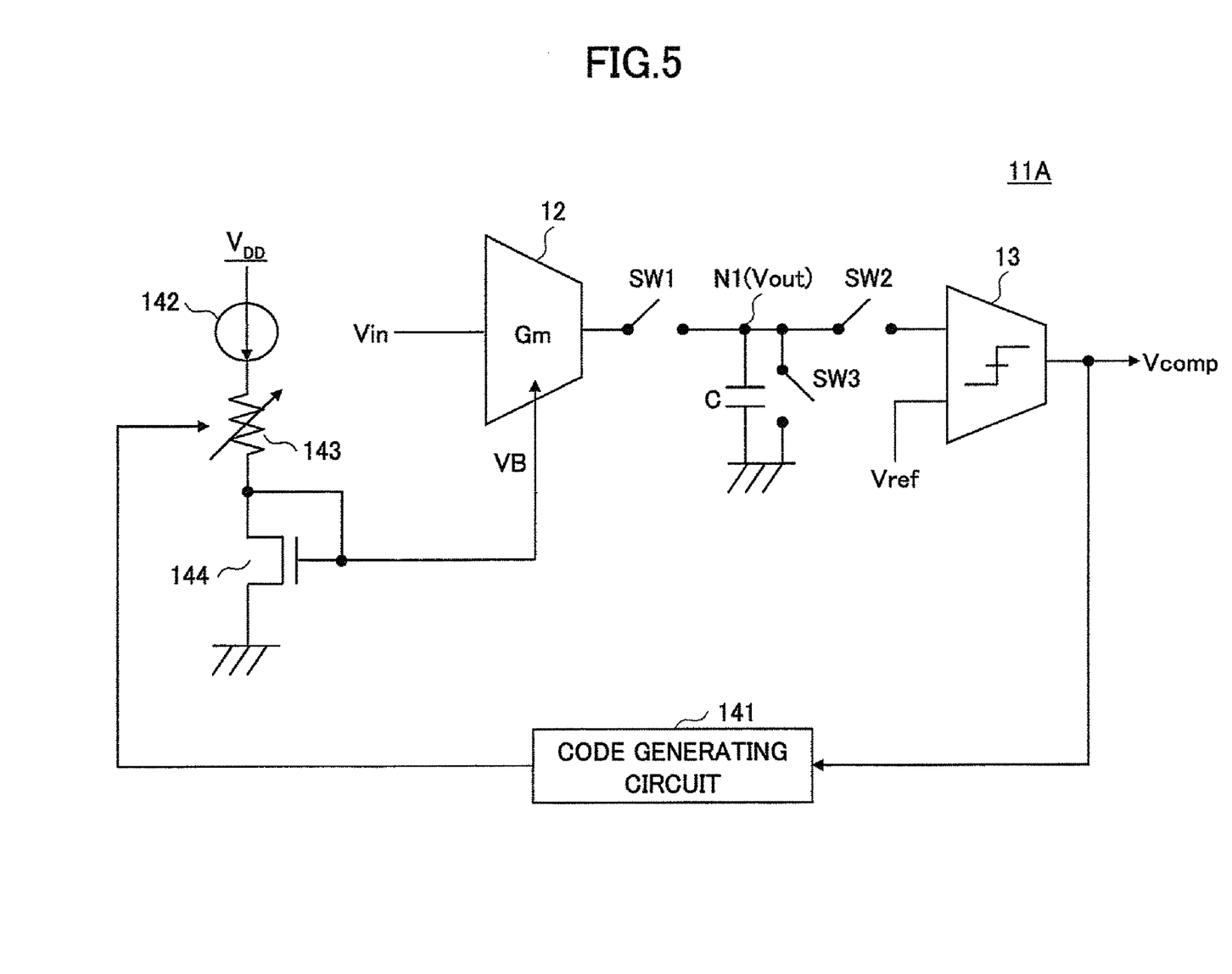
FIG. 5 is a circuit diagram showing a GmC filter circuit in a second embodiment of the present invention.

FIG. 5 is a circuit diagram showing a GmC filter circuit in a second embodiment of the present invention. In FIG. 5, those parts that are the same as those corresponding parts in FIG. 2 are designated by the same reference numerals, and a description thereof will be omitted. A GmC filter circuit 11A includes, in a feedback path of the output signal Vcomp of the comparator circuit 13, a code generating circuit 141, a current source 142, a variable resistor 143 and an NMOS transistor 144 which are connected as shown in FIG. 5. The code generating circuit 141, the current source 142, the variable resistor 143 and the NMOS transistor 144 correspond to the control circuit 14 of the first embodiment shown in FIG. 2.

The code generating circuit 141 maintains the value of an output code when the output signal Vcomp of the comparator circuit 13 has a high level, and increases the value of the output code by a predetermined value when the output signal Vcomp of the comparator circuit 13 has a low level. For example, the value of the output code when the output signal Vcomp of the comparator circuit 13 has the high level is held in a register (not shown) within the code generating circuit 141. A resistance of the variable resistor 143 which is connected to the current source 142 is variable set based on the output code from the code generating circuit 141, and the resistance of the variable resistor 143 increases when the value of the output code increases. The control signal VB which is supplied to the OTA circuit 12 is output from a gate of the NMOS transistor 144 which has the gate and a source that are connected in common to the variable resistor 143 and has a drain that is grounded.

Therefore, it is possible to simultaneously maintain the GmC value of the GmC filter circuit 11A constant and realize a low power consumption of the GmC filter circuit 11A.

Figure 6:
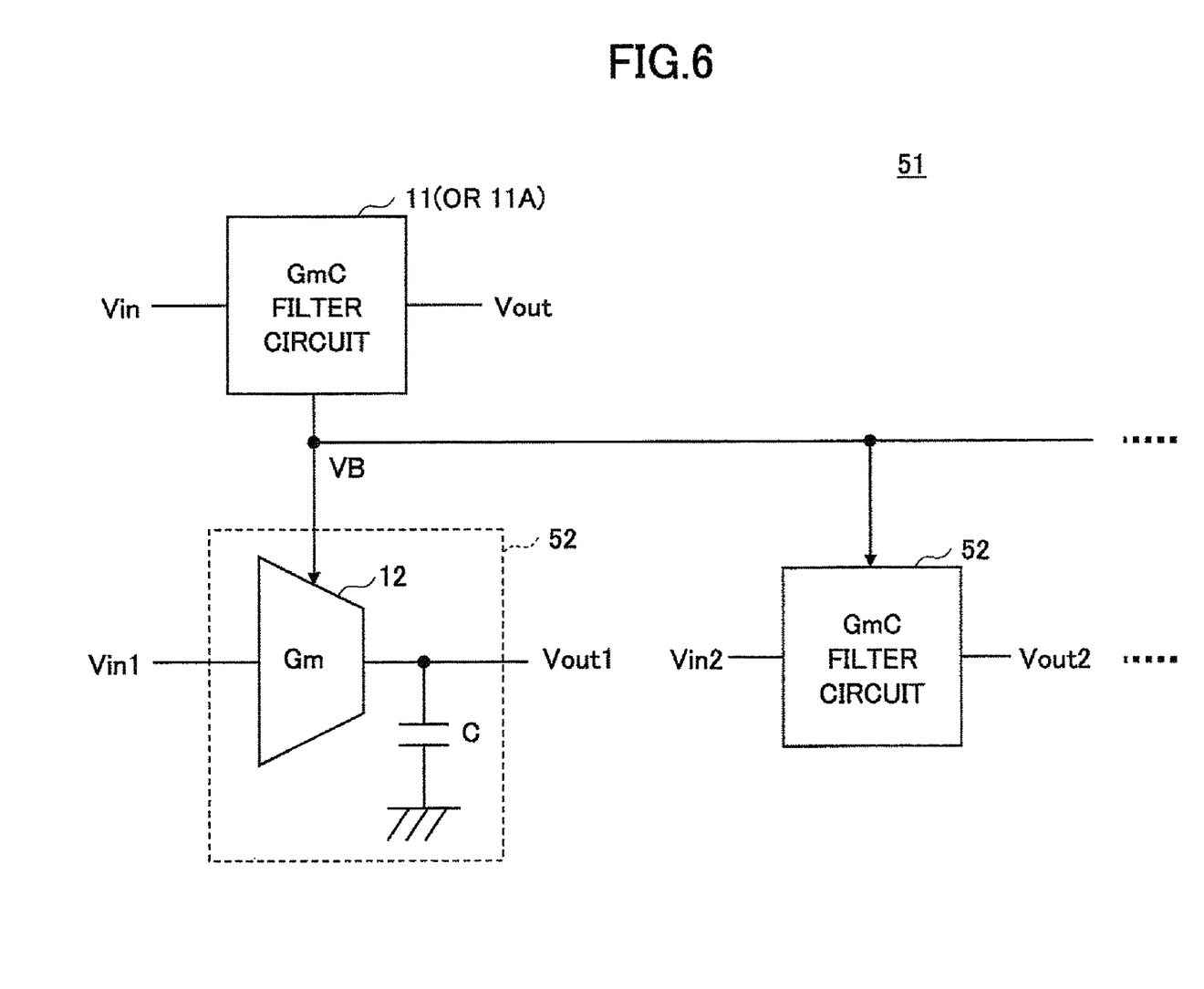
FIG. 6 is a circuit diagram showing a GmC filter circuit in a third embodiment of the present invention.

FIG. 6 is a circuit diagram showing a GmC filter circuit in a third embodiment of the present invention. In FIG. 6, those parts that are the same as those corresponding parts in FIG. 2 are designated by the same reference numerals, and a description thereof will be omitted. In this embodiment, a plurality of GmC filter circuits having the same basic structure are provided within a single semiconductor device.

In a case where a plurality of GmC filter circuits which have the same basic structure and are formed by the same production processes are provided within a single semiconductor device, a control circuit for controlling the Gm value may only be provided with respect to one GmC filter circuit in order to simplify the circuit structure. In this case, the control signal VB which is output from the control circuit is supplied to each of the GmC filter circuits within the single semiconductor device.

More particularly, a first GmC filter circuit 11 of the first embodiment having the structure shown in FIG. 2 or, a first GmC filter circuit 11A of the second embodiment having the structure shown in FIG. 5, and one or a plurality of second GmC filter circuits 52 are provided within a single semiconductor device 51 as shown in FIG. 6. Each second GmC filter circuit 52 has the same basic structure as the first GmC filter circuit 11, and is made up solely of an OTA circuit 12 and a capacitor C which are produced by the same production processes as the OTA circuit 12 and the capacitor C within the GmC filter circuit 11. Alternatively, each second GmC filter circuit 52 has the same basic structure as the first GmC filter circuit 11A, and is made up solely of an OTA circuit 12 and a capacitor C which are produced by the same production processes as the OTA circuit 12 and the capacitor C within the GmC filter circuit 11A. In addition, the control signal VB generated within the first GmC filter circuit 11 or 11A is supplied to the OTA circuit 12 within the first GmC filter circuit 11 or 11A and to the OTA circuit 12 within each second GmC filter circuit 52. As a result, the Gm/C values of all of the first GmC filter circuit 11 or 11A and the one or plurality of second GmC filter circuits 52 are maintained constant and the respective cutoff frequencies Fc are set to desired values. This is because, the first and second GmC filter circuits 11 or 11A and 52 have the same basic structure, and the OTA circuits 12 and the capacitors C of the first and second GmC filter circuits 11 or 11A and 52 are produced by the same production processes. In other words, the inconsistencies in the OTA circuits 12 and the capacitors C introduced at the production stage are the same for each of the first and second GmC filter circuits 11 or 11A and 52. In FIG. 6, Vin1 and Vin2 denote input signals of corresponding second GmC filter circuits 52, and Vout1 and Vout2 denote output signals of the corresponding second GmC filter circuits 52.

Therefore, it is possible to simultaneously maintain the GmC values of the GmC filter circuits 11 or 11A and 52 constant and realize a low power consumption of the GmC filter circuits 11 or 11A and 52, that is, a low power consumption of the semiconductor device 51.

Even if an environment of the electronic apparatus, such as a portable telephone, changes, it becomes possible to automatically and periodically adjust the value of the cutoff frequency Fc by using the GmC filter circuit of the embodiments described above. Consequently, when applied to the portable telephone, for example, it is possible to reduce deterioration in the communication state and the like caused by the change in the environment of the portable telephone.

This application claims the benefit of a Japanese Patent Application No. 2007-193424 filed Jul. 25, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. A cutoff frequency adjusting method for adjusting a cutoff frequency of a GmC filter circuit which has a capacitor and an Operational Transconductance Amplifier (OTA) circuit with a controllable Gm value and a first switch provided between an output terminal of the OTA circuit and an electrode of the capacitor, comprising:
   detecting a Gm value of the OTA circuit based on a voltage of the capacitor which is charged by an output of the OTA circuit; generating a control signal to the OTA circuit using a control circuit comprising a code generating circuit coupled to an adjustable current source in response to the detected Gm value;
   setting a cutoff frequency of the GmC circuit to a certain value by controlling the Gm value of the OTA circuit constant based on the control signal; and,
   wherein the capacitor is charged for a period when the first switch is in an ON state.

2. The cutoff frequency adjusting method as claimed in claim 1, wherein said detecting includes:
   inputting an input signal having a certain value to the OTA circuit;
   charging the capacitor by supplying the output of the OTA circuit to the capacitor for a certain time;
   comparing the voltage of the capacitor which is charged and a voltage of the capacitor when the Gm value having a certain value is obtained; and
   increasing the Gm value of the OTA circuit when the voltage of the capacitor which is charged is lower than the voltage of the capacitor when the Gm value has the certain value.

3. The cutoff frequency adjusting method as claimed in claim 2, further comprising:
   carrying out an initializing process by short-circuiting the capacitor prior to detecting the Gm value in said detecting.

4. The cutoff frequency adjusting method as claimed in claim 3, further comprising:
   controlling, by the control circuit internal or external to the GmC filter circuit, a timing when the capacitor is short-circuited in said carrying out the initializing process, a timing when the capacitor is charged by supplying the output of the OTA circuit to the capacitor for the certain time in said detecting, and a timing when the voltage of the capacitor which is charged and the voltage of the capacitor when the Gm value having the certain value is obtained are compared in said detecting.

5. The cutoff frequency adjusting method as claimed in claim 1, wherein said setting supplies the control signal for controlling the Gm value of the OTA circuit constant to said OTA circuit and to each OTA circuit of one or a plurality of GmC filter circuits each having an OTA circuit identical to said OTA circuit and a capacitor identical to said capacitor in order to adjust the cutoff frequency of two or more GmC filter circuits.

6. A GmC filter circuit comprising:
   an Operational Transconductance Amplifier (OTA) circuit with a controllable Gm value;
   a capacitor;
   a detecting circuit configured to detect a Gm value based on a voltage of the capacitor which is charged by an output of the OTA circuit;
   a control circuit comprising a code generating circuit coupled to an adjustable current source for generating a control signal to set a cutoff frequency of the GmC filter circuit to a certain value by controlling the Gm value of the OTA circuit constant based on the Gm value detected by the detecting circuit; and
   a first switch, provided between an output terminal of the OTA circuit and an electrode of the capacitor, and configured to charge the capacitor by supplying the output of the OTA circuit to the capacitor for a certain time.

7. The GmC filter circuit as claimed in claim 6, wherein the detecting circuit comprises:
   a comparator circuit configured to compare the voltage of the capacitor which is charged and a voltage of the capacitor when the Gm value having a certain value is obtained;
   wherein the control circuit increases the Gm value of the OTA circuit when the comparator circuit outputs a signal indicating that the voltage of the capacitor which is charged is lower than the voltage of the capacitor when the Gm value has the certain value.

8. The GmC filter circuit as claimed in claim 7, further comprising:
   a second switch configured to carry out an initializing process by short-circuiting the capacitor prior to detecting the Gm value by the detecting circuit.

9. The GmC filter circuit as claimed in claim 8, further comprising:
   a third switch configured to supply the voltage of the capacitor which is charged to the comparator circuit.

10. The GmC filter circuit as claimed in claim 8, wherein the control circuit controls a timing when the capacitor is short-circuited by the second switch, a timing when the capacitor is charged by supplying the output of the OTA circuit to the capacitor for the certain time by the first switch, and a timing when the third switch supplies the voltage of the capacitor which is charged to the comparator circuit and the comparator circuit compares the voltage of the capacitor which is charged and the voltage of the capacitor when the Gm value having the certain value is obtained.

11. A semiconductor device comprising:
a GmC filter circuit;
said GmC filter circuit comprising:
- an Operational Transconductance Amplifier (OTA) circuit with a controllable Gm value;
- a capacitor;
- a detecting circuit configured to detect a Gm value based on a voltage of the capacitor which is charged by an output of the OTA circuit;
- a control circuit comprising a code generating circuit coupled to an adjustable current source for generating a control signal to set a cutoff frequency of the GmC filter circuit to a certain value by controlling the Gm value of the OTA circuit constant based on the Gm value detected by the detecting circuit; and
- a first switch, provided between an output terminal of the OTA circuit and an electrode of the capacitor, and configured to charge the capacitor by supplying the output of the OTA circuit to the capacitor for a certain time.

12. The semiconductor device as claimed in claim 11, wherein the detecting circuit comprises:
- a comparator circuit configured to compare the voltage of the capacitor which is charged and a voltage of the capacitor when the Gm value having a certain value is obtained;
- wherein the control circuit increases the Gm value of the OTA circuit when the comparator circuit outputs a signal indicating that the voltage of the capacitor which is charged is lower than the voltage of the capacitor when the Gm value has the certain value.

13. The semiconductor device as claimed in claim 12, further comprising:
- a second switch configured to carry out an initializing process by short-circuiting the capacitor prior to detecting the Gm value by the detecting circuit.

14. The semiconductor device as claimed in claim 13, further comprising:
- a third switch configured to supply the voltage of the capacitor which is charged to the comparator circuit.

15. The semiconductor device as claimed in claim 13, wherein the control circuit controls a timing when the capacitor is short-circuited by the second switch, a timing when the capacitor is charged by supplying the output of the OTA circuit to the capacitor for the certain time by the first switch, and a timing when the third switch supplies the voltage of the capacitor which is charged to the comparator circuit and the comparator circuit compares the voltage of the capacitor which is charged and the voltage of the capacitor when the Gm value having the certain value is obtained.

16. The semiconductor device as claimed in claim 11, further comprising:
- one or a plurality of GmC filter circuits each having an OTA circuit identical to said OTA circuit and a capacitor identical to said capacitor,
- wherein a control signal for controlling the Gm value of the OTA circuit constant is supplied to said OTA circuit and to each OTA circuit of said one or a plurality of GmC filter circuits in order to adjust the cutoff frequency of two or more GmC filter circuits.

* * * * *